US012721214B2

(12) United States Patent
Kodama et al.

(10) Patent No.: US 12,721,214 B2
(45) Date of Patent: Aug. 25, 2026

(54) SEMICONDUCTOR DEVICE AND METHOD OF MANUFACTURING THE SAME

(71) Applicant: DENSO CORPORATION, Kariya-city (JP)

(72) Inventors: Sachio Kodama, Kariya-city (JP); Hiroaki Yoshizawa, Kariya-city (JP); Masanori Ooshima, Kariya-city (JP); Takahiro Hirano, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 662 days.

(21) Appl. No.: 17/829,956

(22) Filed: Jun. 1, 2022

(65) Prior Publication Data

US 2022/0392819 A1 Dec. 8, 2022

(30) Foreign Application Priority Data

Jun. 3, 2021 (JP) ................................. 2021-093612

(51) Int. Cl.

*H10W 74/10* (2026.01)
*H10W 40/77* (2026.01)
*H10W 72/00* (2026.01)
*H10W 72/30* (2026.01)
*H10W 72/90* (2026.01)
*H10W 90/00* (2026.01)

(52) U.S. Cl.

CPC ....... *H10W 74/127* (2026.01); *H10W 40/778* (2026.01); *H10W 72/07354* (2026.01); *H10W 72/347* (2026.01); *H10W 72/931* (2026.01); *H10W 90/736* (2026.01)

(58) Field of Classification Search

None

See application file for complete search history.

(56) References Cited

U.S. PATENT DOCUMENTS

2007/0057373 A1* 3/2007 Okumura ................ H01L 24/32 257/746
2014/0035112 A1* 2/2014 Kadoguchi ....... H01L 23/49575 438/123
2015/0187671 A1* 7/2015 Fukuda ............ H01L 23/49541 257/773

(Continued)

FOREIGN PATENT DOCUMENTS

JP 2017-055044 A 3/2017
JP 2021-077812 A 5/2021

*Primary Examiner* — Jessica S Manno
*Assistant Examiner* — Christopher A. Schodde
(74) *Attorney, Agent, or Firm* — Posz Law Group, PLC

(57) ABSTRACT

A semiconductor device includes a semiconductor element, a sealing member, and a first conductive plate. The semiconductor element includes a first electrode. The sealing member seals the semiconductor element. The first conductive plate includes a first surface facing the first electrode inside the sealing member. The first surface of the first conductive plate includes a mounting region, a roughened region and a non-roughened region. The first electrode is joined to the mounting region. The roughened region is located around the mounting region. The non-roughened region is located between the roughened region and an outer peripheral edge of the first surface. Surface roughness of the roughened region is larger than surface roughness of the non-roughened region.

24 Claims, 12 Drawing Sheets

(56) References Cited

U.S. PATENT DOCUMENTS

| | | | | |
|---|---|---|---|---|
| 2016/0172266 | A1* | 6/2016 | Kadoguchi | H01L 23/49548 257/717 |
| 2016/0207148 | A1* | 7/2016 | Kobayashi | B23K 26/0006 |
| 2016/0233150 | A1* | 8/2016 | Fukui | H01L 23/49562 |
| 2016/0315054 | A1* | 10/2016 | Kajihara | H01L 23/4952 |
| 2019/0237378 | A1 | 8/2019 | Kobayashi et al. | |
| 2019/0355656 | A1 | 11/2019 | Hayashi et al. | |
| 2020/0365491 | A1 | 11/2020 | Kawashima | |
| 2021/0166985 | A1* | 6/2021 | Fuji | H01L 23/49575 |
| 2021/0280551 | A1 | 9/2021 | Fuji | |

* cited by examiner

FIG. 9A
FIG. 9B
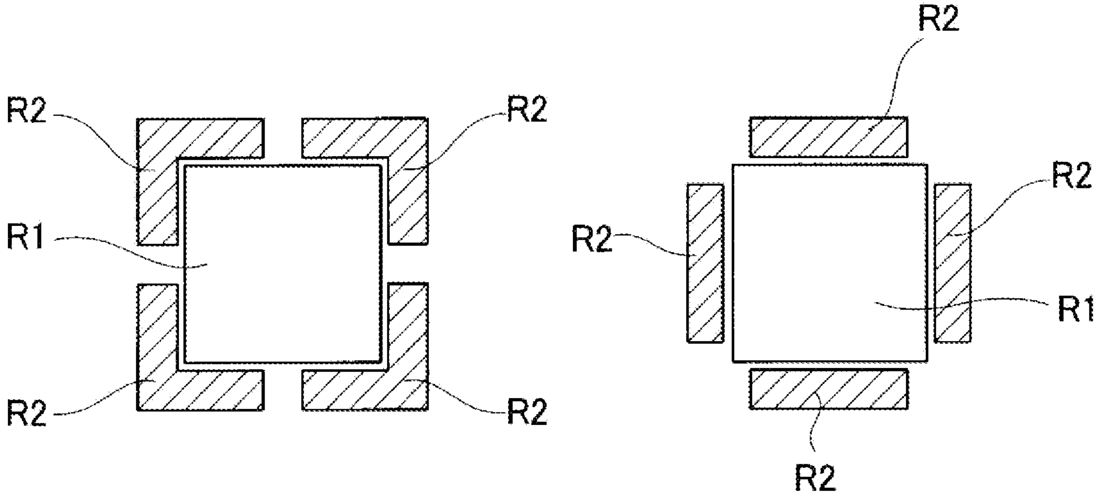
FIG. 9C
FIG. 9D
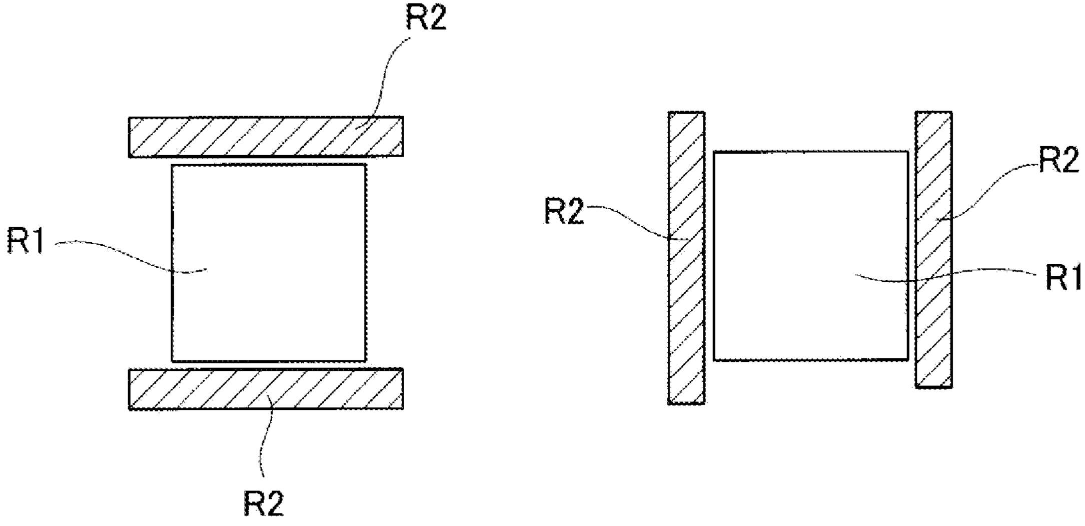

FIG. 10A
FIG. 10B
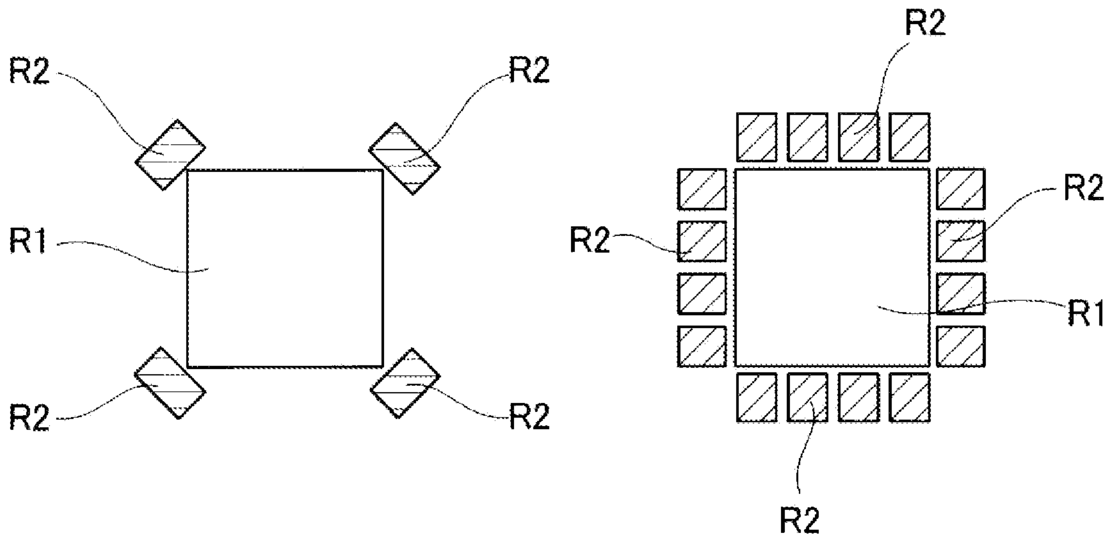
FIG. 10C
FIG. 10D
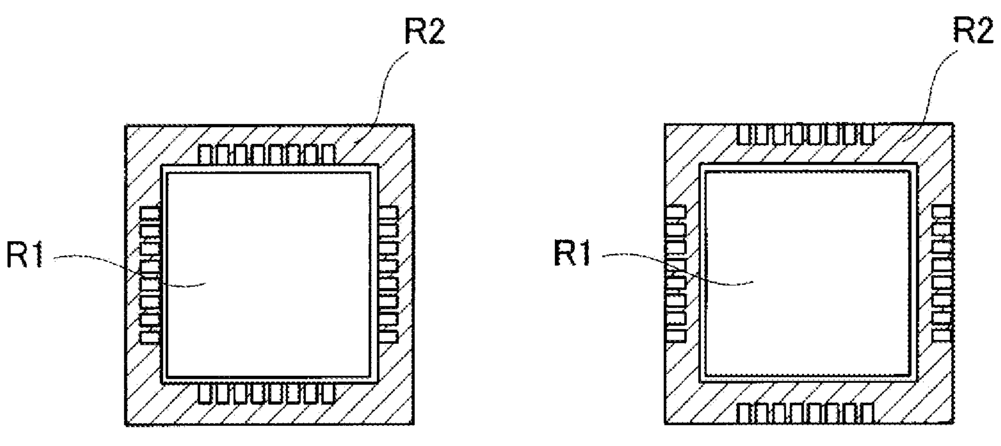

SEMICONDUCTOR DEVICE AND METHOD OF MANUFACTURING THE SAME

CROSS REFERENCE TO RELATED APPLICATIONS

This application is based on Japanese Patent Application No. 2021-093612 filed on Jun. 3, 2021, the disclosure of which is incorporated herein by reference.

TECHNICAL FIELD

The present disclosure relates to a semiconductor device including a semiconductor element, and further relates to a method for manufacturing the semiconductor device.

BACKGROUND

A semiconductor device may include a semiconductor element, a sealant for sealing the semiconductor element, a conductive plate having a surface facing the semiconductor element inside the sealant. The surface of the conductive plate includes a mounting region and a roughened region. The mounting region is a region where electrodes of the semiconductor element are joined, and the roughened region is located around the mounting region. For enhancing the adhesion to a sealing member at the roughened region, the surface roughness may be enhanced by a roughening treatment such as laser irradiation.

SUMMARY

The present disclosure describes a semiconductor device including a semiconductor element, a sealing member and a first conductive plate, and further describes a method for manufacturing the semiconductor device including roughening a portion of a first surface of the first conductive plate.

BRIEF DESCRIPTION OF DRAWINGS

Objects, features and advantages of the present disclosure will become more apparent from the following detailed description made with reference to the accompanying drawings. In the drawings:

FIGS. 9A to 9D respectively illustrate modified examples of the roughened region provided around the mounting region;

FIGS. 10A to 10D respectively illustrate modified examples of the roughened region provided around the mounting region;

DETAILED DESCRIPTION

Figure 1:
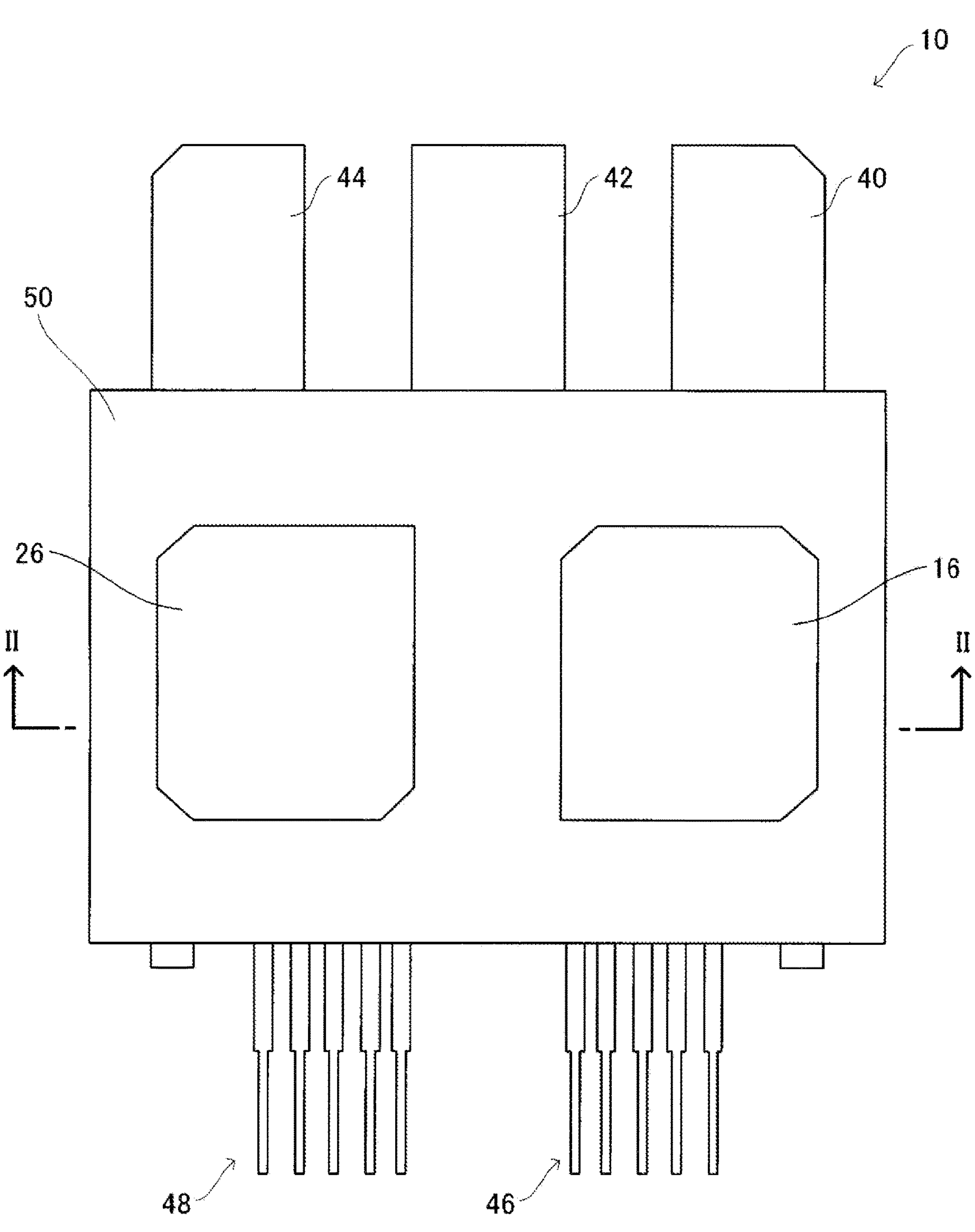
FIG. 1 is a plan view showing a semiconductor device according to an embodiment.
Figure 2:
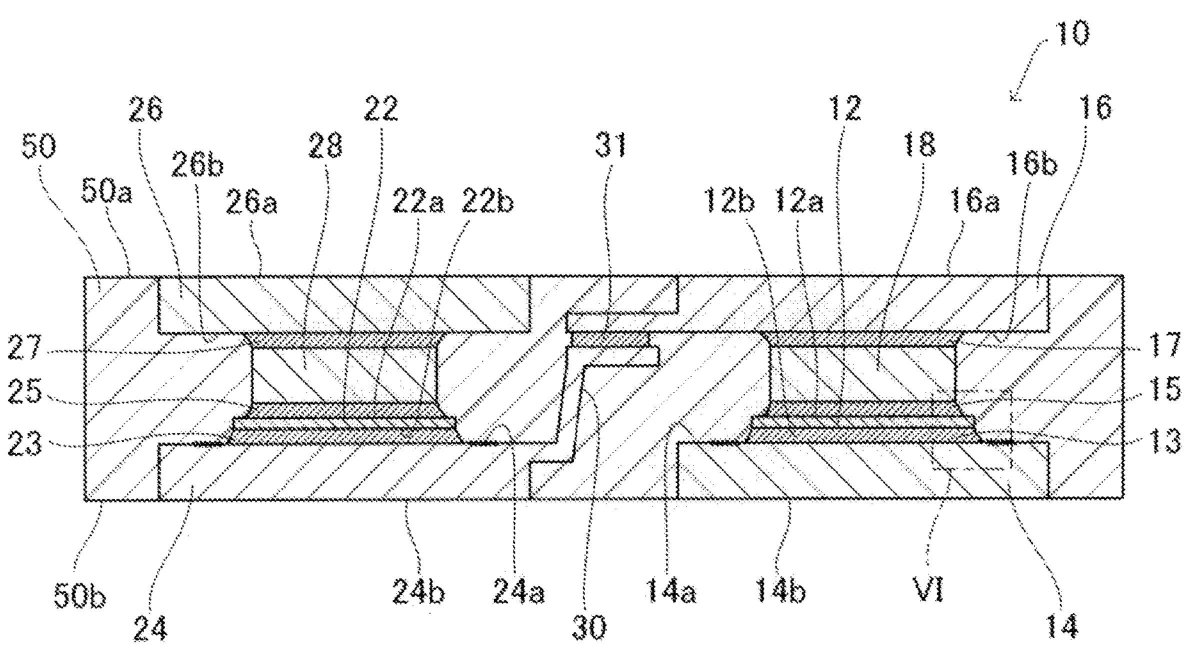
FIG. 2 is a cross-sectional view taken along a line II-II in FIG. 1, and illustrates an internal structure of the semiconductor device.

In a method of manufacturing a semiconductor device, a jig may be adopted to determine the position of the conductive plate, when the semiconductor element and the conductive plate are joined together. When the roughened region is provided for the surface of the conductive plate, the precision of determining the position of the jig may decrease as the jig may be gradually torn and worn by the unevenness of the roughened region. Therefore, it is possible to provide a non-roughened region for a portion of the surface of the conductive plate, and the non-roughened region is supported by the jig. However, peeling may occur between the first conductive plate and the sealant by reducing the area of the roughened region by merely providing the non-roughened region.

According to a first aspect of the present disclosure, a semiconductor device includes a semiconductor element, a sealing member, and a first conductive plate. The semiconductor element includes a first electrode. The sealing member seals the semiconductor element. The first conductive plate includes a first surface facing the first electrode inside the sealing member. The first surface of the first conductive plate includes a mounting region, a roughened region and a non-roughened region. The first electrode is joined to the mounting region. The roughened region is located around the mounting region. The non-roughened region is located between the roughened region and an outer peripheral edge of the first surface. Surface roughness of the roughened region is larger than surface roughness of the non-roughened region.

According to the above structure, the first surface of the first conductive plate includes the mounting region, the roughened region and the non-roughened region. The surface roughness of the non-roughened region is smaller than the surface roughness of the roughened region. When the position of the first conductive plate is determined by using a jig, it is possible to inhibit the wear and tear of the jig by supporting the non-roughened region through the jig. However, as described above, the peeling between the first conductive plate and the sealing member may occur by only providing the non-roughened region. Therefore, the roughened region having relatively strong adhesion to the sealing member is disposed in the vicinity of the semiconductor element as a heat source, and the non-roughened region having relatively weak adhesion to the sealing member is disposed outside the roughened region. According to the above structure, the peeling between the first conductive plate and the sealing member can be effectively inhibited even if the non-roughened region is provided.

According to a second aspect of the present disclosure, a method manufactures a semiconductor device. The method includes: roughening a portion of a first surface of a first conductive plate to form a roughened region at the portion of the first surface; joining at least one member having a semiconductor element to a mounting region; and sealing the semiconductor element joined to the first conductive plate by the sealing member. The mounting region is different from the roughened region at the first surface of the first conductive plate. The roughened region is located around the mounting region, and is located away from an outer peripheral edge of the first surface. In the joining, a non-roughened region of the first surface that is located between the roughened region and the outer peripheral edge is supported by a jig.

Although not particularly limited, in the forming of the roughened region, the roughened region may be formed by irradiating laser on the first surface of the first conductive plate. Therefore, it is possible to freely modify the surface roughness of the roughened region by adjusting the intensity or time of irradiating the laser. In addition, it is possible to freely form the roughened region with various shapes by adjusting a range of irradiating the laser.

According to an embodiment of the present disclosure, a roughened region of a first conductive plate in a semiconductor device may continuously or intermittently extend along outer periphery of a mounting region of a first conductive plate in the semiconductor device. According to such a structure, the adhesion between the first conductive plate and a sealing member in the vicinity of the semiconductor element as a heat source is enhanced so that peeling between the first conductive plate and the sealing member is effective inhibited.

According to the embodiment, the roughened region may continuously extend along an outer edge of the mounting region, and may surround the mounting region. According to such a structure, the area between the mounting region and the non-roughened region is completely isolated by the roughened region. The semiconductor element as the heat source is located at the mounting region. The non-roughened region has relatively weak adhesion to the sealing member. The roughened region has relatively strong adhesion to the sealing member. As a result, the peeling between the first conductive plate and the sealing member can be effectively inhibited.

According to the embodiment, a first surface of the first conductive plate may be covered with a coating film of a metal, and the roughened region may be further covered with an oxide film of the metal. According to such a structure, the coating film of the metal provided at the first surface of the conductive plate may be oxidized by, for example, laser irradiation to form the roughened region having fine unevenness.

According to the embodiment of the present disclosure, the first conductive plate may further include a second surface located at a side opposed to the first surface and exposed to a surface of the sealing member. According to such a structure, the first conductive plate may function as a heat sink for dissipating heat generated by the semiconductor element to outside of the sealing member.

According to the embodiment of the present disclosure, the semiconductor element is a vertical semiconductor element, and may further include a second electrode located at a side opposed to the first electrode. In this case, the semiconductor device may further include a second conductive plate facing the first conductive plate with the semiconductor element interposed between the first conductive plate and the second conductive plate. The second conductive plate may further include a third surface that is joined to the second electrode inside the sealing member. However, the technique disclosed in the present description may also be applied to a semiconductor device adopting the vertical semiconductor element.

According to the embodiment of the present disclosure, the third surface of the second conductive plate may be joined to the second electrode in the semiconductor element through a conductive spacer. However, the third surface of the second conductive plate may be directly joined to the second electrode without through other members such as a conductive spacer.

The second conductive plate may further include a fourth surface located at a side opposed to the third surface and exposed to a surface of the sealing member. According to such a structure, the second conductive plate may function as a heat sink for dissipating heat generated by the semiconductor element to outside of the sealant.

Embodiment

A semiconductor device 10 according to the embodiment is described with reference to drawings. The semiconductor device 10 according to the present embodiment is a power semiconductor device. The semiconductor device 10 may be used for a power converter circuit such as a converter or an inverter in, for example, an electric automobile, a hybrid car or a fuel battery car. However, the use of the semiconductor device 10 is not particularly limited. The semiconductor device 10 can be widely adopted in various devices and circuits.

As shown in FIGS. 1 to 4, the semiconductor device 10 includes a first semiconductor element 12, a second semiconductor element 22, and a sealing member 50. The sealing member 50 seals the first semiconductor element 12 and the second semiconductor element 22, and may also be referred to as an encapsulant, sealing material or a sealant. The sealing member 50 is made of insulation material. Although not particularly limited, the sealing member 50 in the present embodiment is made of sealing material such as an epoxy resin.

The first semiconductor element 12 and the second semiconductor element 22 (hereinafter simply referred to as the semiconductor elements 12, 22 in some occasions) are respectively the power semiconductor elements, and respectively have identical structures. The semiconductor element 12 includes a top surface electrode 12*a*, a bottom surface electrode 12*b*, and multiple signal pads 12*c*. The top surface electrode 12*a* and the signal pads 12*c* are located at the top surface of the first semiconductor element 12, and the bottom surface electrode 12*b* is located at the bottom surface of the first semiconductor element 12. Similarly, the second semiconductor element 22 includes a top surface electrode 22*a*, a bottom surface electrode 22*b*, and multiple signal pads 22*c*.

Although not particularly limited, each of the semiconductor elements 12, 22 is an RC-IGBT (Reverse-Conducting Insulated Gate Bipolar Transistor), and an IGBT and a diode are formed at a single semiconductor substrate. The collector of the IGBT and the cathode of the diode are connected to the bottom surface electrodes 12*b*, 22*b*, and the emitter of the IGBT and the anode of the diode are connected to the top surface electrodes 12*a*, 22*a*. The semiconductor elements 12, 22 may not be particularity limited to the RC-IGBT, they may be other kinds of power semiconductor element such as a MOSFET (Metal-Oxide-Semiconductor Field-Effect Transistor). The material of the semiconductor substrate may not be particularly limited. For example, the material may be silicon (Si), silicon carbide (SiC) and a nitride semiconductor.

The semiconductor device 10 further includes a first bottom conductive plate 14, a first top conductive plate 16, a second bottom conductive plate 24 and a second top conductive plate 26. These conductive plates 14, 16, 24, 26 is made of copper or another metal. A part or all of these conductive plates 14, 16, 24, 26 may be a stacking substrate or an insulating substrate on which a conductor layer is formed. The top surface 14*a* of the first bottom conductive plate 14 and the bottom surface 16*b* of the first top conductive plate 16 face each other inside the sealing member 50, and the first semiconductor element 12 is disposed between both of the surfaces 14*a*, 16*b*.

The bottom surface electrode 12*b* of the first semiconductor element 12 is joined to the top surface 14*a* of the first bottom conductive plate 14. The top surface electrode 12*a* of the first semiconductor element 12 is joined to the bottom surface 16*b* of the first top conductive plate 16 through the conductive spacer 18. Although not particularly limited, the bottom surface electrode 12*b* of the first semiconductor element 12 is joined to the top surface 14*a* of the first bottom conductive plate 14 through a solder layer 13. The top surface electrode 12*a* of the first semiconductor element 12 is joined to the bottom surface of the first conductive spacer 18 through a solder layer 15. The top surface of the first conductive spacer 18 is joined to the bottom surface 16*b* of the first top conductive plate 16 through a solder layer 17. As a result, the first bottom conductive plate 14 and the first top conductive plate 16 are electrically connected through the first semiconductor element 12.

Similarly, the top surface 24*a* of the second bottom conductive plate 24 and the bottom surface 26*b* of the second top conductive plate 26 face each other inside the sealing member 50, and the second semiconductor element 22 is disposed between both of the surfaces 24*a*, 26*b*. Although not particularly limited, the bottom surface electrode 22*b* of the second semiconductor element 22 is joined to the top surface 24*a* of the second bottom conductive plate 24 through a solder layer 23. The top surface electrode 22*a* of the second semiconductor element 22 is joined to the bottom surface 16*b* of the first top conductive plate 16 through a conductive spacer 28. The top surface electrode 22*a* of the second semiconductor element 22 is joined to the bottom surface of the second conductive spacer 28 through a solder layer 25, and the top surface of the second conductive spacer 28 is joined to the bottom surface 26*b* of the second top conductive plate 26 through a solder layer 27. As a result, the second bottom conductive plate 24 and the second top conductive plate 26 are electrically connected through the second semiconductor element 22.

The second bottom conductive plate 24 is electrically connected to the first top conductive plate 16 at a joint 30 located inside the sealing member 50. As a result, the first semiconductor element 12 and the second semiconductor element 22 are electrically connected in series. For example, a portion of the joint 30 is formed integrally with the second bottom conductive plate 24, and the other portion of the joint 30 is formed integrally with the first top conductive plate 16. The second bottom conductive plate 24 and the first top conductive plate 16 are joined together through a solder layer 31. However, at least a portion of the joint 30 may be made of a member independent from the first top conductive plate 16 and the second bottom conductive plate 24.

The bottom surface 14*b* of the first bottom conductive plate 14 and the bottom surface 24*b* of the second bottom conductive plate 24 are exposed at the bottom surface 50*b* of the sealing member 50. Therefore, the first bottom conductive plate 14 and the second bottom conductive plate 24 are not only included in a portion of an electrical conduction path in the semiconductor deice 10, but also respectively function as heat sinks for dissipating the heat of the semiconductor elements 12, 22 outward. Similarly, the top surface 16*a* of the first top conductive plate 16 and the top surface 26*a* of the second top conductive plate 26 are exposed from the top surface 50*a* of the sealing member 50. As a result, the first top conductive plate 16 and the second top conductive plate 26 are not only included in a portion of the electrical conduction path in the semiconductor device 10, but also respectively function as heat sinks for dissipating the heat of the semiconductor elements 12, 22 outward.

The semiconductor device 10 further includes a first power terminal 40 (P-terminal), a second power terminal 42 (N-terminal), and a third power terminal 44 (O-terminal). These three power terminals 40, 42, 44 extend through the sealing member 50. As an example, three power terminals 40, 42, 44 are parallel to each other, and protrude from the sealing member 50 along a first direction, in other words, a vertical direction in FIG. 1. The first power terminal 40 is electrically connected to the first bottom conductive plate 14 inside the sealing member 50. The second power terminal 42 is electrically connected to the second top conductive plate 26 inside the sealing member 50. The third power terminal 44 is electrically connected to the second bottom conductive plate 24 inside the sealing member 50. Although not particularly limited, in the semiconductor device 10 according to the present embodiment, the first power terminal 40 is integrally formed with the first bottom conductive plate 14, and the third power terminal 44 is integrally formed with the second bottom conductive plate 24.

The semiconductor device 10 further includes first signal terminals 46 and second signal terminals 48. The first signal terminals 46 and the second signal terminals 48 are located at a side opposed to three power terminals 40, 42, 44 with the sealing member 50 interposed therebetween. The first signal terminals 46 are parallel to each other, and protrude from the sealing member 50 along the first direction, in other words, the vertical direction in FIGS. 1, 2. The first signal terminals 46 are respectively connected to the signal pads 12*c* of the first semiconductor element 12 inside the sealing member 50. The first signal terminals 46 include, for example, a gate signal terminal for sending a gate signal to the first semiconductor element 12. The first signal terminals 46 are respectively connected to the signal pads 12*c* through bonding wires 36. However, the first signal terminals 46 may be directly connected to the signal pads 12*c* through, for example, soldering or brazing.

Similarly, the second signal terminals 48 are parallel to each other, and protrude from the sealing member 50 along the first direction. The second signal terminals 48 are respectively connected to the signal pads 22*c* of the second semiconductor element 22 inside the sealing member 50. The second signal terminals 48 include, for example, a gate signal terminal for sending a gate signal to the second semiconductor element 22. The second signal terminals 48 are respectively connected to the signal pads 22*c* through bonding wires 38. However, the second signal terminals 48 may be directly connected to the signal pads 22*c* through, for example, soldering or brazing.

In the semiconductor device 10 according to the present embodiment, the first power terminal 40 and the third power terminal 44 are connected through the first semiconductor element 12, and the second power terminal 42 and the third power terminal 44 are connected through the second semiconductor element 22. The first semiconductor element 12 and the second semiconductor element 22 respectively have built-in IGBTs as switching elements. The first semiconductor element 12 and the second semiconductor element 22 are independently turned on and turned off when the gate signal is received from the first signal terminal 46 or the second signal terminal 48. The semiconductor device 10 according to the present embodiment can be included in a pair of upper and lower arms in a power conversion circuit such as a converter or an inverter.

Figure 3:
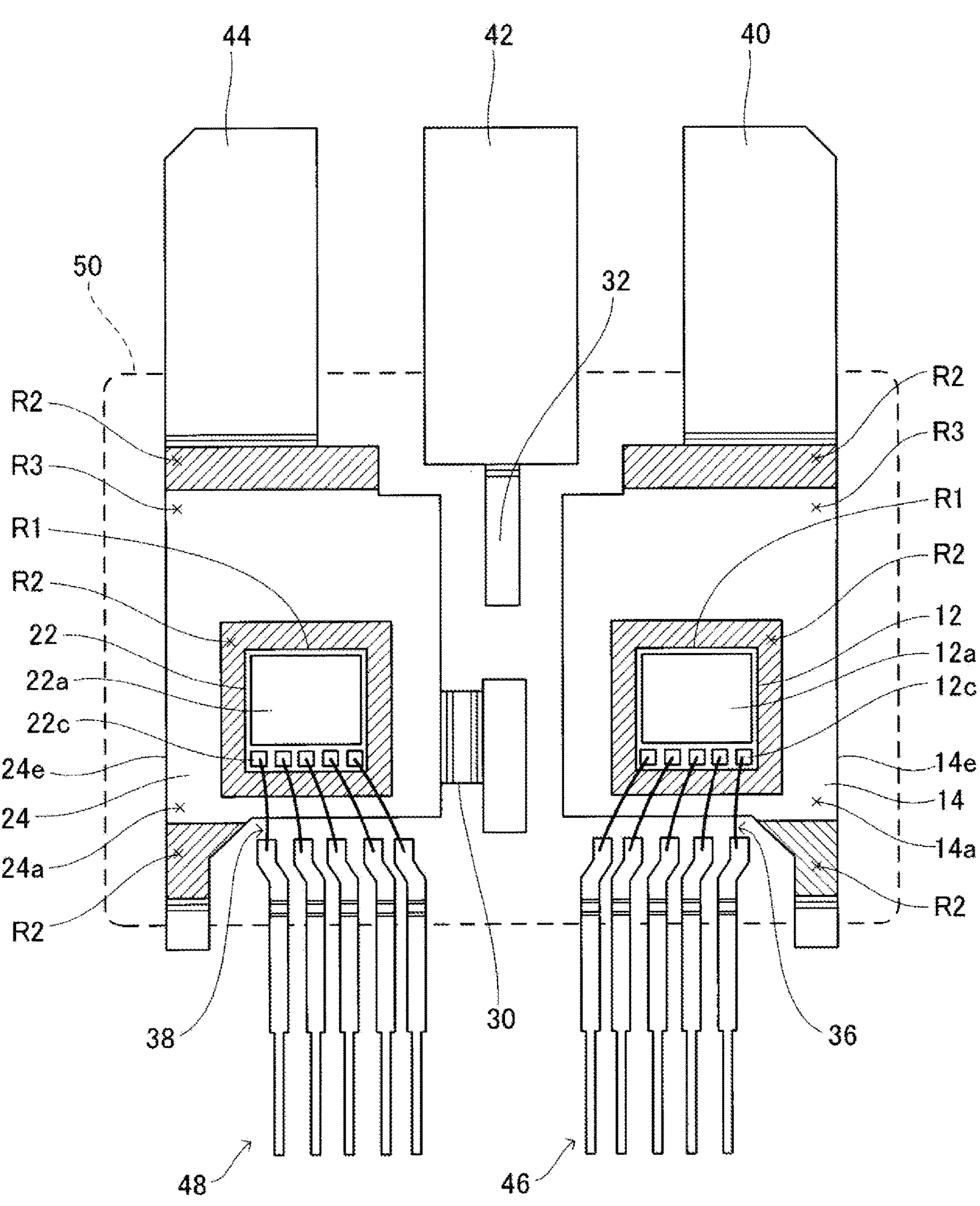
FIG. 3 is a plan view where the illustration of a first top conductive plate, a second top conductive plate and a sealant is omitted from the plan view shown in FIG. 1, and illustrates the internal structure of the semiconductor device.
Figure 4:
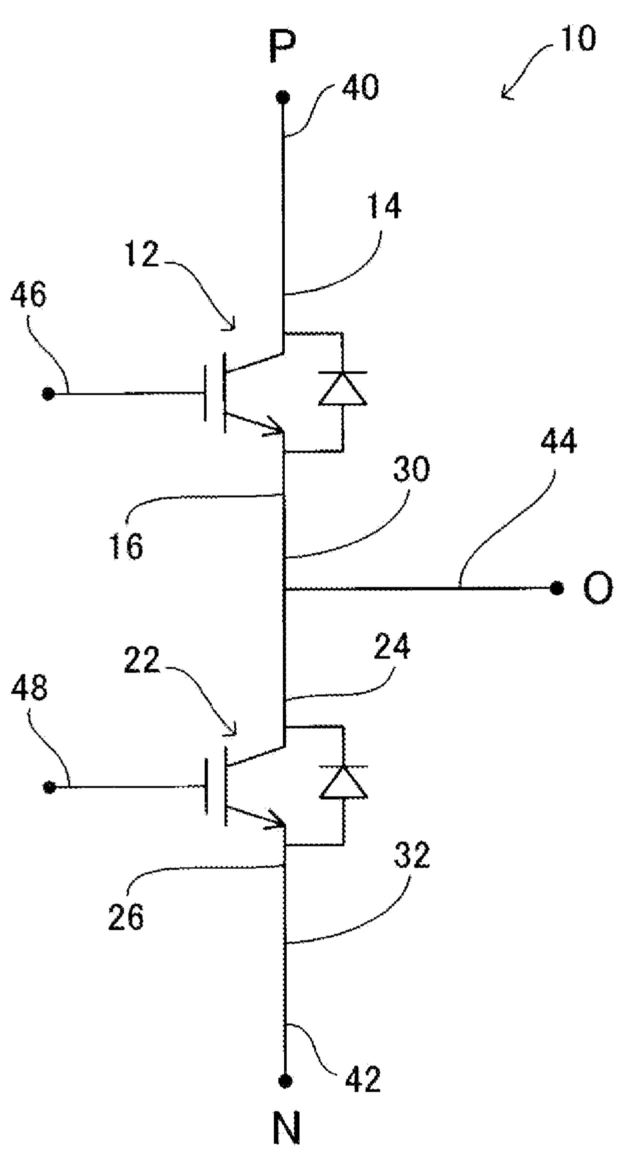
FIG. 4 is a circuit diagram that shows an electrical configuration of the semiconductor device.
Figure 5:
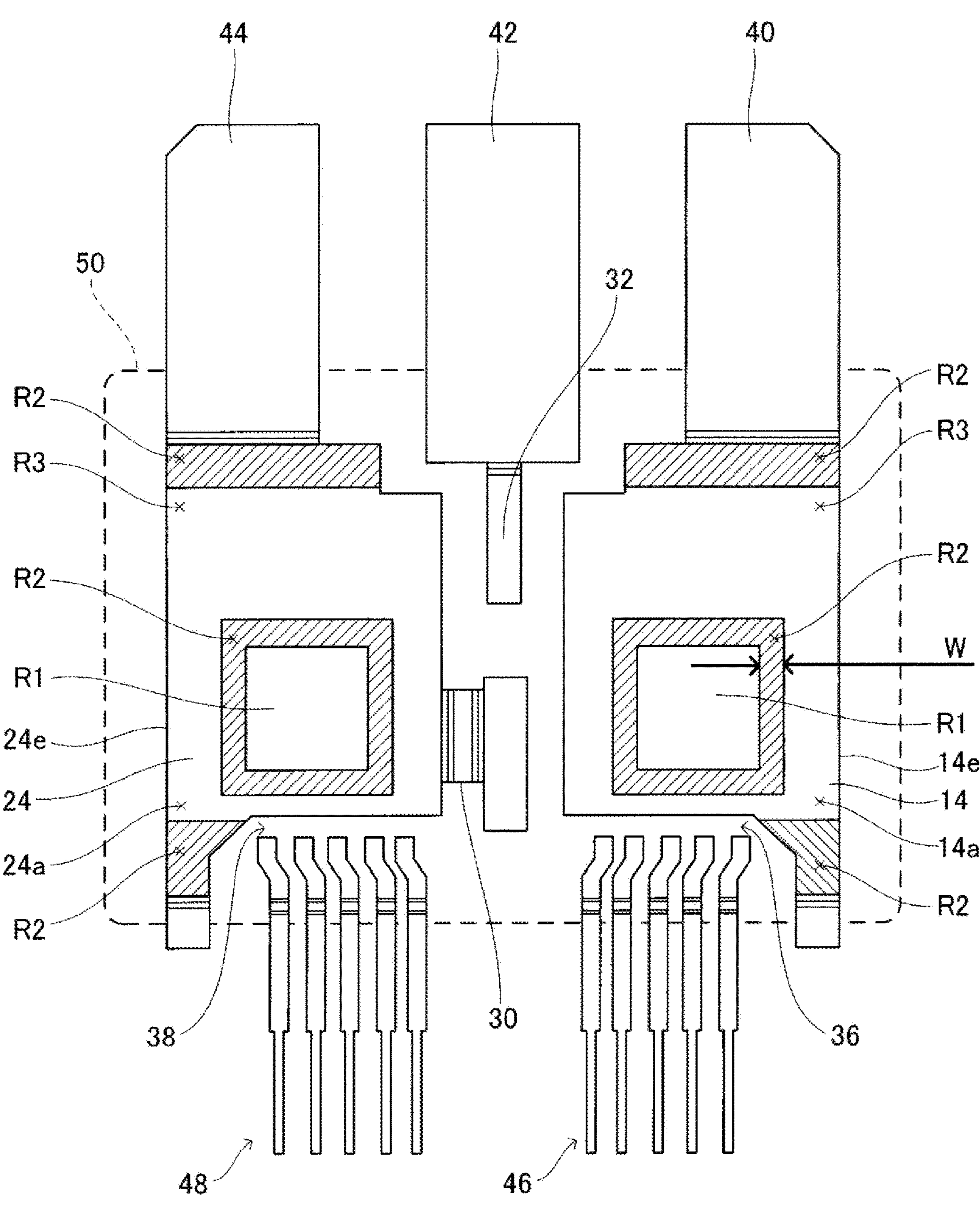
FIG. 5 is a plan view that shows a mounting region, a roughened region and a non-roughened region that are provided at respective top surfaces of a first bottom conductive plate and a second bottom conductive plate.

As illustrated in FIGS. 3 and 5, the top surface 14*a* of the first bottom conductive plate 14 includes a mounting region R1, a roughened region R2, and non-roughened region R3. The mounting region R1 is a region on which the first semiconductor element 12 mounts. The bottom surface electrode 12*b* of the first semiconductor element 12 is joined to the mounting region R1. The roughened region R2 is a roughened region, and has larger surface roughness than the mounting region R1 and the non-roughened region R3. The roughened region R2 is located around the mounting region R1. Although not particularly limited, the roughened region in the present embodiment continuously extend along the outer peripheral edge of the mounting region R1 and surrounds the mounting region R1. Although the width W of the roughened region R2 is not particularly limited, the width W may be set larger than or equal to 0.5 millimeters (mm).

The non-roughened region R3 is located between the roughened region R2 and the outer peripheral edge 14*e* of the top surface 14*a* of the first bottom conductor plate 14. Although not particularly limited, the non-roughened region R3 according to the present embodiment continuously extends from the outer side of the roughened region R2 to the outer peripheral edge 14*e* of the top surface 14*a*. The non-roughened region R3 is completely isolated from the mounting region R1 by the roughened region R2 formed in a ring shape. The non-roughened region R3 is a region without being roughened, and has smaller surface roughness than the roughened region R2. The particular configuration of each of the roughened region R2 and the non-roughened region R3 is not particularly limited.

Figure 6:
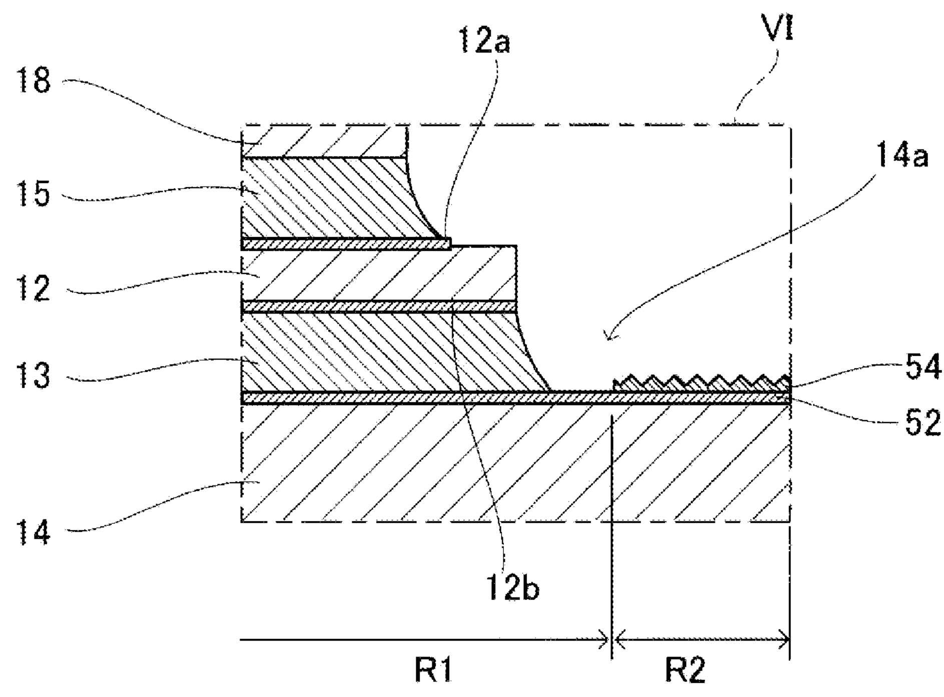
FIG. 6 is an enlarged view of a VI-VI portion in FIG. 2, and shows a cross-sectional structure at the top surface of the first bottom conductive plate.

For example, as illustrated in FIG. 6, in the semiconductor device 10 according to the present embodiment, the top surface 14*a* of the first bottom conductive plate 14 is covered with a coating film 52 of a metal such as nickel, and the top surface 14*a* is further covered with an oxide film 54 of the metal in the roughened region R2. Although not particularly limited, it is possible to form the roughened region R2 with fine unevenness by laser irradiation on the coating film 52 of the metal disposed at the top surface 14*a*.

Figure 7:
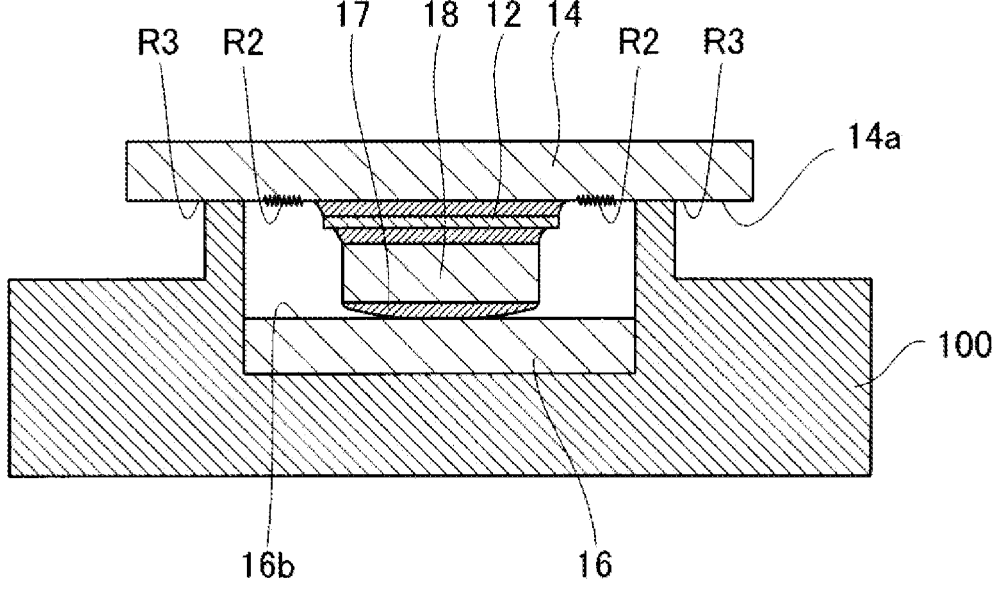
FIG. 7 shows a state in which the first bottom conductive plate is supported by a jig when the semiconductor device is manufactured.

As illustrated in FIG. 7, in the process of manufacturing the semiconductor device 10, the position of the first bottom conductive plate is determined by using the jig 100. When the non-roughened region R3 is disposed at the top surface 14*a* of the first bottom conductive plate 14, it is possible to suppress the wear and tear of the jig 100 by supporting the non-roughened region though the jig 100. As a result, it is possible to avoid the situation that the manufacturing quality of the semiconductor device 10 is deteriorated due to the wear and tear of the jig 100.

The peeling between the first bottom conductive plate 14 and the sealing member 50 may occur by merely providing the non-roughened region R3 at the top surface 14*a* of the first bottom conductive plate 14. Therefore, the roughened region R2 with relatively strong adhesion to the sealing member 50 may be arranged in the vicinity of the first semiconductor element 12 as a heat source, and the non-roughened region R3 with relatively low adhesion to the sealing member 50 may be disposed outside the roughened region R2. According to such a structure, even though the non-roughened region R3 is present, the peeling between the first bottom conductive plate and the sealing member 50 can be effectively suppressed.

Figure 8:
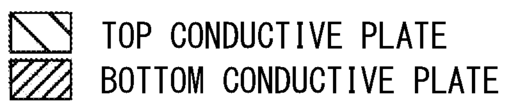
FIG. 8 shows an example of the relationship among a width of the roughened region, a shear stress generated between the first bottom conductive plate and the sealant, and a shear stress generated between the first top conductive plate and the sealant.
Figure 8:
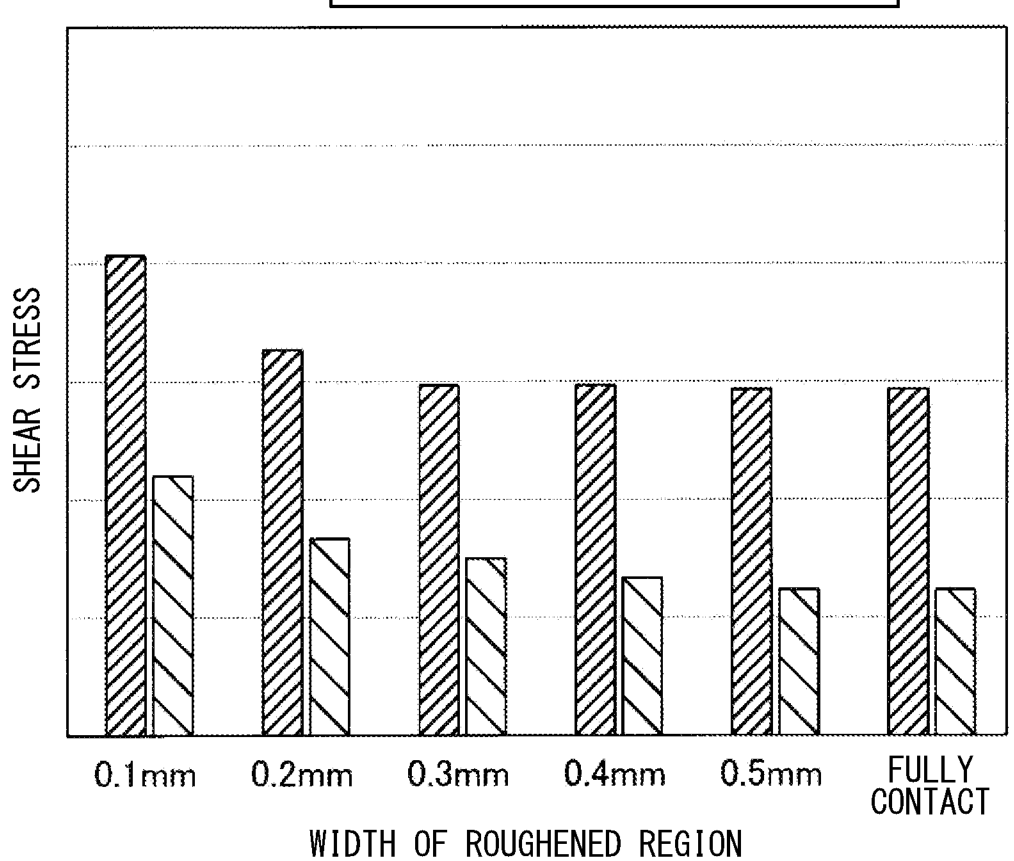
Figure 11:
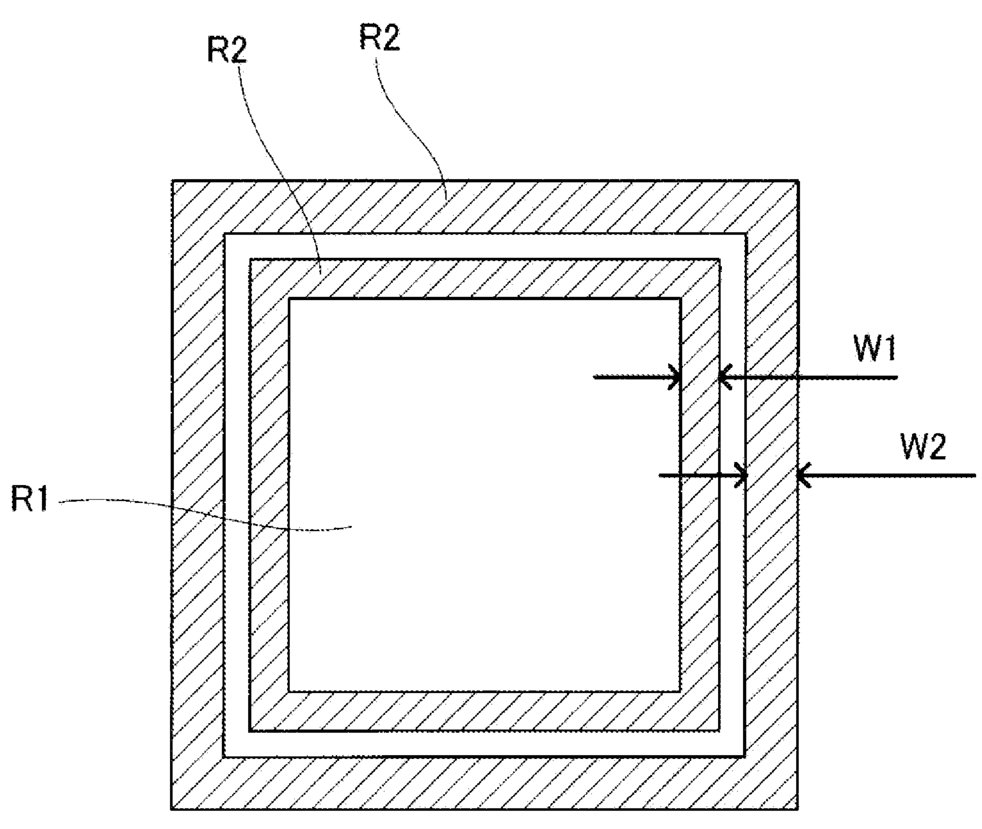
FIG. 11 illustrates a modified example of the roughened region provided around the mounting region, and illustrates an annular roughened region provided in multiple layers for the mounting region.

FIG. 8 shows simulated data for evaluating the relationship among the width W of the roughened region R2, a shear stress generated between the first bottom conductive plate 14 and the sealing member 50, and a shear stress generated between the first top conductive plate 16 and the sealing member 50. As illustrated in FIG. 7, as the width W of the roughened region R2 gets larger, the shear stress generated between the first bottom conductive plate 14 and the sealing member 50 decreases, and the shear stress generated between the first top conductive plate 16 and the sealing member 50 also decreases. In other words, as the width W of the roughened region R2 gets larger, the peeling of the sealing member 50 hardly occurs. When the width W of the roughened region R2 is 0.5 mm or larger, it is confirmed that the peeling of the sealing member 50 is suppressed as in a situation where the roughened region R2 is provided at the entire top surface 14*a* of the first bottom conductive plate 14.

The configuration related to the first bottom conductive plate 14 may also be adopted for the second bottom conductive plate 24. As similar to the first bottom conductive plate 14, the mounting region R1, the roughened region R2 and the non-roughened region R3 are disposed also at the top surface 24*a* of the second bottom conductive plate 24.

As shown in FIGS. 9A to 9D, 10A to 10D and 11, it is possible to vary the shape of the roughened region R2 in various forms. For example, as illustrated in FIGS. 9A, 9B, the roughened region R2 may be intermittently disposed along the outer peripheral edge of the mounting region R1. As shown in FIGS. 9C, 9D, the roughened region R2 may be disposed along only a part of the outer peripheral edge of the mounting region R1. As illustrated in FIGS. 10A, 10B, the roughened region R2 may be the collection of multiple sections. In this situation, the roughened region R2 may be disposed only at the corner portion of the mounting region R1, or may be disposed at a location except the corner portion of the mounting region R1. As illustrated in FIGS. 100, 10D, at least one non-roughened region may be disposed inside the roughened region R2 formed in the ring shape. In a modified example shown in FIG. 11, multiple roughened regions R2 are formed to surround the mounting region R1. In this situation, the sum of the widths W1, W2 of the respective roughened regions R2 may be 0.5 mm or larger. In other words, the mathematical relation of $W1+W2 \geq 0.5$ mm is satisfied.

Figure 12:
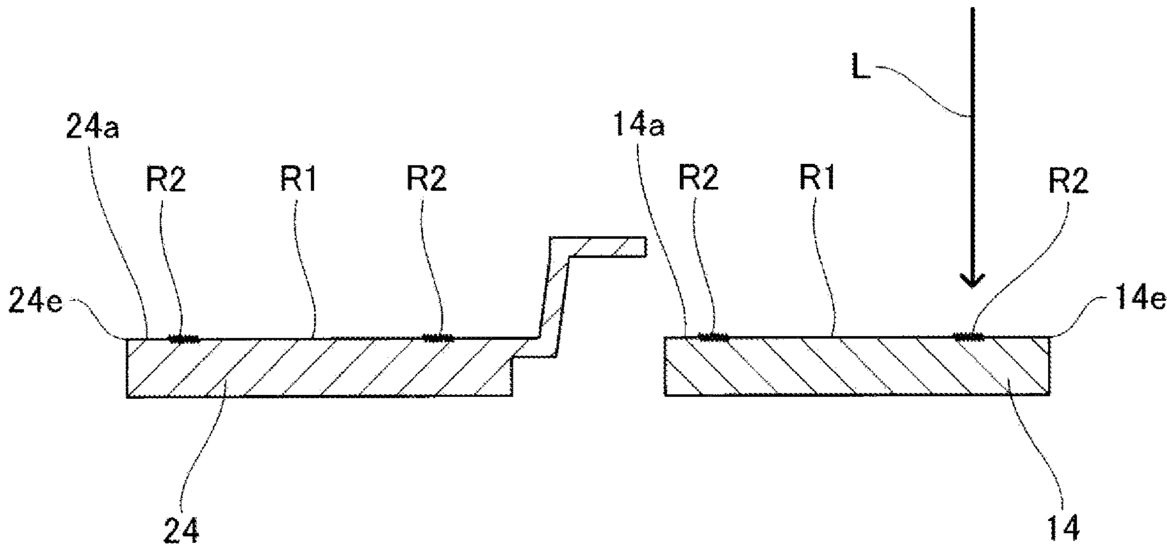
FIG. 12 illustrates a process in the method of manufacturing the semiconductor device, in particular, the formation of the roughened region by irradiating laser to the respective top surfaces of the bottom conductive plates.

The following describes the method of manufacturing the semiconductor device 10 with reference to FIGS. 12 to 15. As illustrated in FIG. 12, firstly, a portion of the top surface 14*a* of the first bottom conductive plate 14 and a portion of the top surface 24*a* of the second bottom conductive plate 24 are roughened, and the roughened region R2 is formed at a portion of each of the top surfaces 14*a*, 24*a*. The roughened region R2 is disposed around the mounting region R1, and is located away from the outer peripheral edges 14*e*, 24*e* of the respective top surfaces 14*a*, 24*a*. Although not particularly limited, in this process, the roughened region R2 may be formed by irradiating laser L on each of the top surfaces 14*a*, 24*a* of the respective first bottom conductive plate 14 and the second bottom conductive plate 24.

Figure 13:
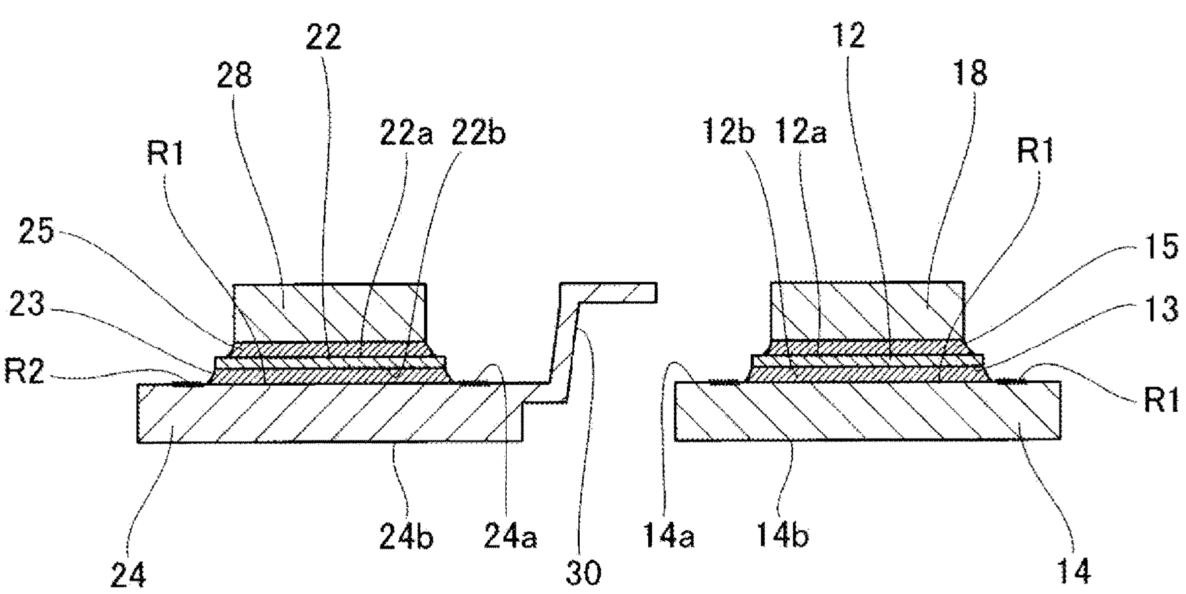
FIG. 13 illustrates a process in the method of manufacturing the semiconductor device, in particular, the situation of joining the semiconductor elements and conductive spacers to the mounting region at respective top surfaces of the bottom conductive plates.
Figure 14:
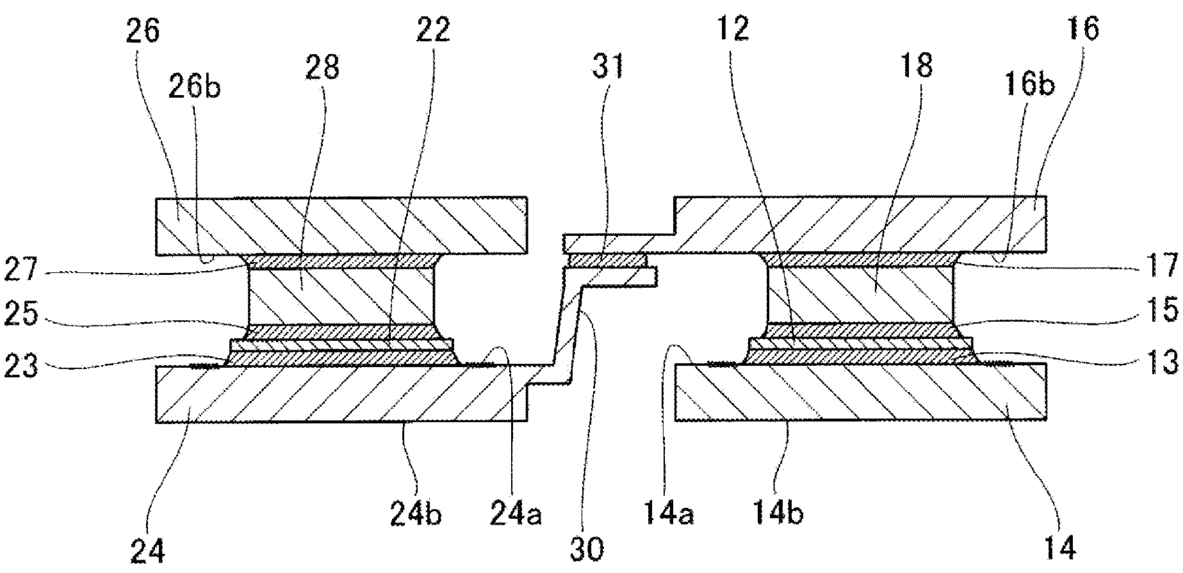
FIG. 14 illustrates a process in the method of manufacturing the semiconductor device, and illustrates the situation of joining the top conductive plates to the conductive spacers.
Figure 15:
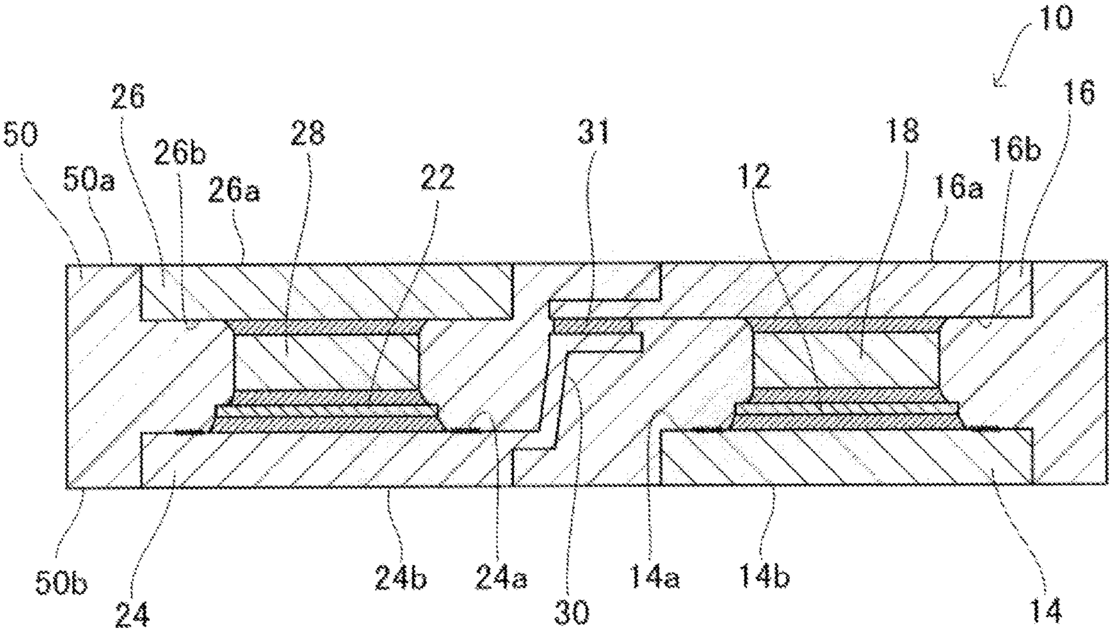
FIG. 15 illustrates a process of manufacturing the semiconductor device, and illustrates the formation of the sealant for sealing the semiconductor elements.

As illustrated in FIG. 13, the first semiconductor element 12 and the first conductive spacer 18 are joined to the mounting region R1 of the first bottom conductive plate 14, and the second semiconductor element 22 and the second conductive spacer 28 are joined to the mounting region R1 of the second bottom conductive plate 24. As illustrated in FIG. 14, the first top conductive plate 16 is joined to the first conductive spacer 18, and the second top conductive plate 26 is joined to the second conductive spacer 28. In the process illustrated in FIGS. 13, 14, the first semiconductor element 12 and other required members are joined to the mounting region R1 of the first bottom conductive plate 14, and the second semiconductor element 22 and other required members are joined to the mounting region R1 of the second bottom conductive plate 24. In these joining processes, as shown in FIG. 7, the first bottom conductive plate 14 and the second bottom conductive plate 24 may be supported by using the jig 100. In this situation, the non-roughened region R3 located outside the roughened region R2 may be supported by the jig 100 to inhibit the wear and tear of the jig 100.

As illustrated in FIG. 14, the first semiconductor element 12 and the second semiconductor element 22 are sealed by the formation of the sealing member 50. For example, the sealing member 50 may be formed by insert molding. Subsequently, the semiconductor device 10 is completed by carrying out other necessary processes.

Although specific examples of the techniques disclosed in the present specification have been described in detail above, these are merely examples and do not limit the scope of the present specification. Each of the first semiconductor element 12 and the second semiconductor element 22 described in the present embodiment corresponds to a semiconductor element. Each of the bottom surface electrode 12*b* of the first semiconductor element 12 and the bottom surface electrode 22*b* of the second semiconductor element 22 described in the present embodiment corresponds to a first electrode of the semiconductor element. Each of the top surface electrode 12*a* of the first semiconductor element 12 and the top surface electrode 22*a* of the second semiconductor element 22 described in the present embodiment corresponds to a second electrode of the semiconductor element. Each of the first bottom conductive plate 14 and the second bottom conductive plate 24 described in the present embodiment corresponds to a first conductive plate. Each of the top surface 14*a* of the first bottom conductive plate 14 and the top surface 24*a* of the second bottom conductive plate 24 described in the present embodiment corresponds to a first surface of the first conductive plate. Each of the bottom surface 14*b* of the first bottom conductive plate 14 and the bottom surface 24*b* of the second bottom conductive plate 24 described in the present embodiment corresponds to a second surface of the first conductive plate. Each of the first top conductive plate 16 and the second top conductive plate 26 described in the present embodiment corresponds to a second conductive plate. Each of the bottom surface 16*b* of the first top conductive plate 16 and the bottom surface 26*b* of the second top conductive plate 26 described in the present embodiment corresponds to a third surface of the second conductive plate. Each of the top surface 16*a* of the first top conductive plate 16 and the top surface 26*a* of the second top conductive plate 26 described in the present embodiment corresponds to a fourth surface of the second conductive plate.

The techniques described in the present description include various modifications and modifications of the specific examples illustrated above. The technical elements described in the present specification or the drawings exhibit technical usefulness alone or in various combinations, and are not limited to the combinations described in the present description at the time of filing. The techniques illustrated in the present specification or drawings can achieve multiple objectives at the same time, and achieving one of the objectives itself has technical usefulness.

What is claimed is:

1. A semiconductor device comprising:

a semiconductor element including a first electrode;

a sealing member configured to seal the semiconductor element;

a first conductive plate including a first surface facing the first electrode inside the sealing member; and a power terminal being integrally formed with the first conductive plate and protruding from the sealing member, wherein the first surface of the first conductive plate includes:

a mounting region to which the first electrode is joined;

a plurality of roughened regions located around the mounting region;

a first non-roughened region located between two of the plurality of roughened regions region and an outer peripheral edge of the first surface; and a second non-roughened region located between the two of the plurality of roughened regions, wherein the two of the plurality of roughened regions are a first roughened region and a second roughened region, wherein the plurality of roughened regions further includes a third roughened region formed to abut a base end of the power terminal, wherein surface roughness of each of the plurality of roughened regions is larger than surface roughness of the both the first and second non-roughened regions, wherein the two of the plurality of roughened regions surround the mounting region concentrically, wherein a sum of respective widths of the plurality of roughened regions is equal to or larger than 0.6 millimeters, and wherein, in a top view of the first surface, the third roughened region is between the base end of the power terminal and the first non-roughened region.

2. The semiconductor device according to claim 1, wherein the plurality of roughened regions continuously or intermittently extend along an outer peripheral edge of the mounting region.

3. The semiconductor device according to claim 2, wherein the plurality of roughened regions continuously extend along the outer peripheral edge of the mounting region, and surround the mounting region.

4. The semiconductor device according to claim 1, wherein the first surface of the first conductive plate is covered with a coating film of a metal, and the plurality of roughened regions of the first surface are further covered with an oxide film of the metal.

5. The semiconductor device according to claim 1, wherein the first conductive plate further includes a second surface that is located at a side opposed to the first surface and is exposed at a first surface of the sealing member.

6. The semiconductor device according to claim 1, further comprising:

a second conductive plate facing the first conductive plate with the semiconductor element interposed between the first conductive plate and the second conductive plate, wherein the semiconductor element further includes a second electrode located at a side opposed to the first electrode, and wherein the second conductive plate includes a third surface joined to the second electrode inside the sealing member.

7. The semiconductor device according to claim 6, further comprising:

a conductive spacer, wherein the third surface of the second conductive plate is joined to the second electrode of the semiconductor element through the conductive spacer.

8. The semiconductor device according to claim 7, wherein the second conductive plate further includes a fourth surface that is located at a side opposed to the third surface and is exposed at a second surface of the sealing member.

9. The semiconductor device according to claim 1, wherein one of the plurality of roughened regions is adjacent to the mounting region, and is between the mounting region and the second non-roughened region.

10. The semiconductor device according to claim 1, wherein the respective widths of the plurality of roughened regions are in a direction that intersects the mounting region, the roughened regions, and the non-roughened region, as viewed in a direction perpendicular to the first surface, and the sum of the respective widths is equal to or larger than 0.5 millimeters.

11. The semiconductor device according to claim 1, wherein the respective widths of the roughened regions are in a direction that intersects the mounting region, the roughened regions, and the non-roughened region, as viewed in a direction perpendicular to the first surface.

12. The semiconductor device according to claim 1, wherein the third roughened region is formed on only one side of the mounting region.

13. The semiconductor device according to claim 1, wherein the third roughened region extends along an entire side edge of the first conductive plate.

14. The semiconductor device according to claim 1, wherein the first non-roughened region extends from a second outer peripheral edge of the first surface to a third outer peripheral edge of the first surface opposite the second outer peripheral edge.

15. A method for manufacturing a semiconductor device, the method comprising:

roughening a portion of a first surface of a first conductive plate to form a plurality of roughened regions at the portion of the first surface;

joining at least one member having a semiconductor element to a mounting region, wherein the mounting region is different from the plurality of roughened regions at the first surface of the first conductive plate;

sealing the semiconductor element joined to the first conductive plate by a sealing member; and forming a power terminal that is formed integrally with the first conductive plate and protrudes from the sealing member;

wherein the plurality of roughened regions are located around the mounting region, and are located away from an outer peripheral edge of the first surface, wherein, in the joining, a non-roughened region of the first surface that is located between each of the roughened regions and the outer peripheral edge is supported by a jig, wherein two of the plurality of roughened regions surround the mounting region concentrically, wherein the two of the plurality of roughened regions are a first roughened region and a second roughened region, wherein a sum of respective widths of the two of the plurality of roughened regions is larger than 0.6 millimeters, wherein the two of the plurality of roughened regions are separated by a gap, wherein the gap between the two of the plurality of roughened regions has a second surface roughness smaller than a first surface roughness of the two of the plurality of roughened regions, and wherein the plurality of roughened regions further includes a third roughened region formed to abut a base end of the power terminal, and wherein, in a top view of the first surface, the third roughened region is between the base end of the power terminal and the first non-roughened region.

16. The method according to claim 15, wherein, in the forming of the plurality of roughened regions, the plurality of roughened regions are formed by irradiating laser on the first surface of the first conductive plate.

17. A semiconductor device comprising:

a semiconductor element including an electrode;

a sealing member sealing the semiconductor element;

a conductive plate includes a surface that faces the electrode inside the sealing member; and a power terminal that is integrally formed with the conductive plate and protrudes from the sealing member, wherein the surface of the conductive plate includes:

a mounting region to which the electrode is joined;

a first roughened region surrounding the mounting region;

a non-roughened region located between an outer periphery of the first surface and the first roughened region; and a second roughened region located between a base end of the power terminal and the non-roughened region and formed to abut the base end of the power terminal, wherein a surface roughness of each of the first roughened region and the second roughened region is larger than a surface roughness of the non-roughened region.

18. The semiconductor device according to claim 17, wherein the electrode is a first electrode, the conductive plate is a first conductive plate, the semiconductor device further comprising:

a second conductive plate disposed opposite to the first conductive plate, the semiconductor element being interposed between the first conductive plate and the second conductive plate, wherein the semiconductor element further includes a second electrode disposed opposite to the first electrode, and the second conductive plate has a surface to which the second electrode is joined through a conductive spacer inside the sealing member.

19. The semiconductor device according to claim 18, further comprising:

a signal terminal protruding from the sealing member and being connected to a signal pad of the semiconductor element, wherein the sealing member is between the power terminal and the signal terminal.

20. The semiconductor device according to claim 19, wherein the semiconductor element is a first semiconductor element, the signal terminal is a first signal terminal, the power terminal is a first power terminal, the semiconductor device further comprising:

a second semiconductor element including a third electrode and a fourth electrode and being sealed in the sealing member;

a third conductive plate having a surface facing the third electrode inside the sealing member;

a fourth conductive plate disposed opposite to the third conductive plate, the second semiconductor element being interposed between the third conductive plate and the fourth conductive plate, the fourth conductive plate having a surface to which the fourth electrode is joined through a conductive spacer inside the sealing member;

a second power terminal protruding from the sealing member and being electrically connected to the fourth conductive plate inside the sealing member;

a third power terminal integrally formed with the third conductive plate and protruding from the sealing member;

a second signal terminal protruding from the sealing member and being connected to a signal pad of the second semiconductor element inside the sealing member; and a joint that is located inside the sealing member and electrically connected between the second conductive plate and the third conductive plate, wherein the surface of the third conductive plate includes:

a mounting region to which the third electrode is joined;

a first roughened region surrounding the mounting region;

a non-roughened region located between the first roughened region and an outer periphery of the third conductive plate; and a second roughened region being adjacent to a location to which a base terminal of the third power terminal is connected, and a surface roughness of each of the first roughened region and the second roughened region of the third conductive plate is larger than a surface roughness of the non-roughened region of the third conductive plate.

21. The semiconductor device according to claim 19, wherein the signal terminal is one of a plurality of signal terminals.

22. The semiconductor device according to claim 21, wherein the signal terminal is connected to the signal pad through either wiring bonding or soldering.

23. The semiconductor device according to claim 20, wherein the first power terminal, the second power terminal, and the third power terminal are parallel to each other, and extend in a straight line from the sealing member in a same direction.

24. The semiconductor device according to claim 21, wherein the plurality of signal terminals are parallel to each other, and extend in a straight line from the sealing member in a same direction.

* * * * *